US009911912B2

(12) United States Patent
Krohn et al.

(10) Patent No.: US 9,911,912 B2
(45) Date of Patent: Mar. 6, 2018

(54) PIEZOELECTRIC COMPOSITE AND METHOD OF FORMING SAME

(71) Applicant: General Electric Company, Schenectady, NY (US)

(72) Inventors: Matthew Harvey Krohn, Reedsville, PA (US); Kwok Pong Chan, Troy, NY (US)

(73) Assignee: General Electric Company, Schenectady, NY (US)

( * ) Notice: Subject to any disclaimer, the term of this patent is extended or adjusted under 35 U.S.C. 154(b) by 778 days.

(21) Appl. No.: 14/260,844

(22) Filed: Apr. 24, 2014

(65) Prior Publication Data

US 2015/0311424 A1  Oct. 29, 2015

(51) Int. Cl.
| | |
|---|---|
| *H01L 41/18* | (2006.01) |
| *B06B 1/06* | (2006.01) |
| *C08G 77/14* | (2006.01) |
| *C08L 83/06* | (2006.01) |
| *H01L 41/37* | (2013.01) |
| *C08G 59/22* | (2006.01) |
| *C08G 59/24* | (2006.01) |
| *C08G 59/30* | (2006.01) |
| *C08L 63/00* | (2006.01) |

(52) U.S. Cl.
CPC ............ *H01L 41/183* (2013.01); *B06B 1/06* (2013.01); *B06B 1/0622* (2013.01); *C08G 59/223* (2013.01); *C08G 59/24* (2013.01); *C08G 59/306* (2013.01); *C08G 77/14* (2013.01); *C08L 63/00* (2013.01); *C08L 83/06* (2013.01); *H01L 41/37* (2013.01)

(58) Field of Classification Search
CPC .............................. H01L 41/37; H01L 41/183
USPC .................................................. 310/328, 358
See application file for complete search history.

(56) References Cited

U.S. PATENT DOCUMENTS

| | | | |
|---|---|---|---|
| 5,043,622 A | * | 8/1991 | Sagong ................. H01L 41/183 252/62.9 PZ |
| 5,340,510 A | | 8/1994 | Bowen |
| 5,660,877 A | | 8/1997 | Venkataramani et al. |
| 5,818,149 A | * | 10/1998 | Safari ..................... H01L 41/37 310/358 |
| 5,844,349 A | | 12/1998 | Oakley et al. |
| 7,573,182 B2 | | 8/2009 | Savage |

(Continued)

FOREIGN PATENT DOCUMENTS

| | | |
|---|---|---|
| EP | 1227525 A2 | 7/2002 |
| EP | 2363430 A1 | 9/2011 |

(Continued)

OTHER PUBLICATIONS

PCT Search Report and Written Opinion issued in connection with corresponding PCT Application No. PCT/US2015/026351 dated Jul. 13, 2015.

*Primary Examiner* — Thomas Dougherty
*Assistant Examiner* — Karen B Addison
(74) *Attorney, Agent, or Firm* — Barclay Damon LLP

(57) ABSTRACT

A piezoelectric composite for use in an ultrasonic transducer and a method of forming the same is provided. The composite has a piezoelectric ceramic component and a hydrophobic polymer component arranged to form a 1-3, 2-2, or 3-3 composite type. In one embodiment, the hydrophobic polymer is selected to polymerize at a moderate temperature.

15 Claims, 5 Drawing Sheets

(56) References Cited

U.S. PATENT DOCUMENTS

| 8,129,884 B2 | 3/2012 | Rinner et al. |
| 2013/0000399 A1 | 1/2013 | Lilly et al. |

FOREIGN PATENT DOCUMENTS

| EP | 2447329 A1 | 5/2012 |
| KR | 102007-119982 | 12/2007 |
| WO | WO-00/31808 | 6/2000 |

* cited by examiner

PIEZOELECTRIC COMPOSITE AND METHOD OF FORMING SAME

BACKGROUND OF THE INVENTION

The subject matter disclosed herein relates to piezoelectric composites and, in particular, to 1-3, 2-2 and 3-3 piezoelectric composites for use in moist environments.

Conventional ultrasonic transducers are constructed from one or more piezoelectric elements. One type of ultrasonic transducer element is a piezoelectric composite comprising piezoelectric ceramic material surrounded by a piezoelectrically passive polymer matrix. Ultrasonic transducers formed from these piezoelectric composites can experience an unusually short lifetime, when the ultrasonic transducers are used in moist or underwater environments. These ultrasonic transducers show a reduction in gain early in their operational life. The use of what most would consider a watertight case is not effective due to the construction of the ultrasonic probes. Probe construction often requires use of multiple types of materials with different thermal expansion coefficients, which can lead to the formation of interface dis-bonds during manufacturing and/or operation. In addition, the front surface of the probe is designed to maximize acoustic transmission and is often very thin which allows water to quickly diffuse to the piezoelectric material. It is therefore desirable to provide an improved piezoelectric composite that addresses at least some of these shortcomings.

The discussion above is merely provided for general background information and is not intended to be used as an aid in determining the scope of the claimed subject matter.

BRIEF DESCRIPTION OF THE INVENTION

A piezoelectric composite for use in an ultrasonic transducer and a method of forming the same is provided. The composite has a piezoelectric ceramic component and a hydrophobic polymer component arranged to form a 1-3, 2-2, or 3-3 composite type. In one embodiment, the hydrophobic polymer is selected to polymerize at a moderate temperature. An advantage that may be realized in the practice of some disclosed embodiments of the piezoelectric composite is the composite resists reductions in gain and/or has a longer operational lifetime in moist or underwater environments.

In a first embodiment, a piezoelectric composite is provided. The piezoelectric composite comprises a plurality of piezoelectric ceramic components and a hydrophobic polymer component. The plurality of piezoelectric ceramic components and the hydrophobic polymer component are arranged to form a composite type selected from the group consisting of a 1-3 composite type, a 2-2 composite type, and a 3-3 composite type.

In a second embodiment, a method of forming a piezoelectric composite is provided. The method comprises steps of dicing a ceramic to form a plurality of piezoelectric ceramic components, wherein the step of dicing forms grooves between each piezoelectric ceramic component while leaving each piezoelectric ceramic component monolithically joined to a back plate. The grooves are filled with a reaction mixture comprising a photoacid generator and an epoxide monomer selected to provide a hydrophobic polymer component. A polymerization reaction is initiated in the reaction mixture. The polymerization reaction cures to form the hydrophobic polymer component within the grooves, thereby forming a piezoelectric composite.

In a third embodiment, an ultrasonic transducer is provided. The ultrasonic transducer comprises a piezoelectric composite comprising a plurality of piezoelectric ceramic components and a hydrophobic polymer component, wherein the plurality of piezoelectric ceramic components and the hydrophobic polymer component are arranged to form a composite type selected from the group consisting of a 1-3 composite type, a 2-2 composite type and a 3-3 composite type. The ultrasonic transducer comprises a printed circuit board that provides an electrical connection between the plurality of piezoelectric ceramic components and a cable, a substrate contacting terminal ends of the plurality of piezoelectric ceramic components to provide an acoustic energy transmission window, and a case, joined to the substrate to encase the piezoelectric composite and the printed circuit board, wherein the cable provides an electrical connection outside of the case.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which.

DETAILED DESCRIPTION OF THE INVENTION

Figure 1:
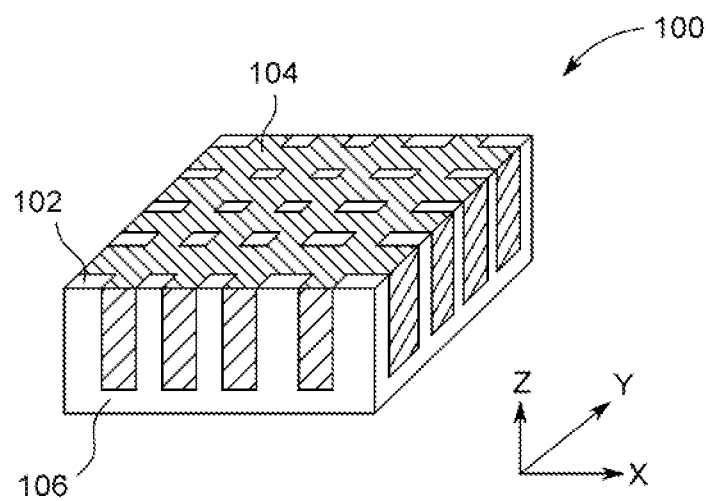
FIG. 1 is a perspective view of an exemplary piezoelectric composite after the it has been filled with a polymer, which is cured.

Some piezoelectric composite probes have been found to experience gain loss during operation, which leads to shortened operational lifetimes. Without wishing to be bound by any particular theory, intrusion of water into the piezoelectric composite appears to be responsible for this shortcoming and, for reasons related to the probe construction, a watertight casing does not consistently solve this lifetime problem. This disclosure provides piezoelectric composites having 1-3, 2-2 and 3-3 arrangements for addressing at least some of these problems.

The delicate nature of 1-3, 2-2 and 3-3 composite types, used in ultrasonic probes, raises certain processing concerns. To address some of these concerns, the grooves between each of the plurality of piezoelectric ceramic components are filled with a filler polymer (e.g. an epoxy) that serves several purposes. The filler polymer omits air from between the plurality of piezoelectric ceramic components that could result in breakdown during the application of an electric field to the piezoelectric components. Electric fields are used to invoke a mechanical displacement of the piezoelectric material, which generates the acoustic pressure. Electric fields are also used to align the dipoles in the piezoelectric materials, which improves the perceived piezoelectric response. The filler polymer also keeps the plurality of piezoelectric ceramic components in position during the grinding operation and otherwise adds toughness to the system during its operational lifetime. The filler polymer also functions as a mask during the sputtering operation and thereby prevents the thin layer of the electrode material from being deposited on the sides of the plurality of piezoelectric ceramic components. It also acts as a support for the electrode material allowing for lateral electrical connection between the piezoelectric ceramic components of the piezoelectric composite.

While the filler polymer is a desirable component, use of the filler polymer introduces further complications into the fabrication of the piezoelectric composite. Most filler polymers and piezoelectric ceramic components have very different coefficients of thermal expansion (CTE). It is therefore problematic to use a filler polymer that is thermally cured above room temperature, as the increased temperatures would cause the polymer component and the piezoelectric ceramic component to expand/contract at different rates, which will lead to stresses and mechanical deformation. A polymer component that cures at or near room temperature is often selected for the manufacturing of piezoelectric composites, but the use of some types of polymer components produces a piezoelectric composite that experiences reduction in gain and shortened operational lifetime. In addition, because piezoelectric composites are relatively thin (0.1 to 5 mm) relative to their lateral dimensions (6 to 150 mm), they are very susceptible to interaction with water (short diffusion dimensions). The polymer components used to fill piezoelectric composites can often show exaggerated effects relative to their bulk properties due to a small thickness dimension.

Figure 2:
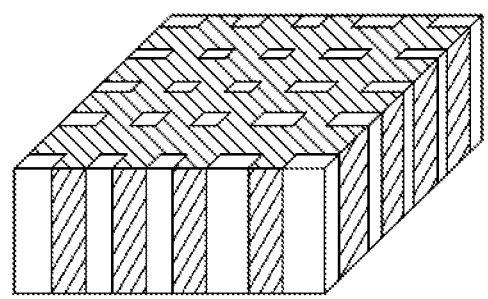
FIG. 2 is a perspective view of an exemplary piezoelectric composite after a grinding operation.

FIG. 1 is a perspective view of an exemplary piezoelectric composite 100 comprising a plurality of piezoelectric ceramic components 102 and a hydrophobic polymer component 104. In the exemplary embodiment of FIG. 1, the piezoelectric ceramic components 102 and the hydrophobic polymer component 104 are arranged as a 1-3 composite type, wherein the piezoelectric ceramic components 102 have one degree of connectivity (the Z axis) and the hydrophobic polymer component 104 has three degrees of connectivity (the X, Y and Z axes). The piezoelectric ceramic components 102 may be made, for example, by sequential dicing and grinding operations. In the dicing operation, a series of grooves are cut in a ceramic along two perpendicular axes (e.g., the X and Y axis). The grooves are cut to a sufficient depth in the direction of the Z axis so as to leave a back plate 106 joined to the plurality of piezoelectric ceramic components 102. The grooves between each of the plurality of piezoelectric ceramic components 102 are then filled with a reaction mixture that, after curing, produces the hydrophobic polymer component 104. After curing, the back plate 106 may be removed by, for example, grinding. The grooves have a dimension such that about 20% to about 80% by volume of the piezoelectric composite 100 is occupied by the plurality of piezoelectric ceramic components 102 with the balance of the volume being the hydrophobic polymer component 104. In other embodiments, the piezoelectric composite 100 comprises about 30% to about 60% by volume of the plurality of piezoelectric ceramic components 102 with the balance of the volume being the hydrophobic polymer component 104. In other embodiments, the piezoelectric composite 100 comprises about 30% by volume of the plurality of piezoelectric ceramic components 102 with the balance being the hydrophobic polymer component 104. In other embodiments, the piezoelectric composite 100 comprises about 20% to about 70% by volume of the plurality of piezoelectric ceramic component 102 with the balance being the hydrophobic polymer component 104 mixed with an inorganic powder, such as silica or alumina. In the grinding operation, a terminal end of the piezoelectric composite 100 is removed until a desired thickness has been achieved. In one embodiment of a 1-3 composite type, after the grinding operation, the piezoelectric ceramic components 102 are posts that have a length-to-width aspect ratio of at least 2.5 to 1 and, in one embodiment, about 5 to 1. In some embodiments, a thin layer of an electrode material is deposited on the piezoelectric composite 100 by, for example, sputtering. FIG. 2 is a depiction of a piezoelectric composite after the grinding operation has been completed and the back plate has been removed.

Figure 3:
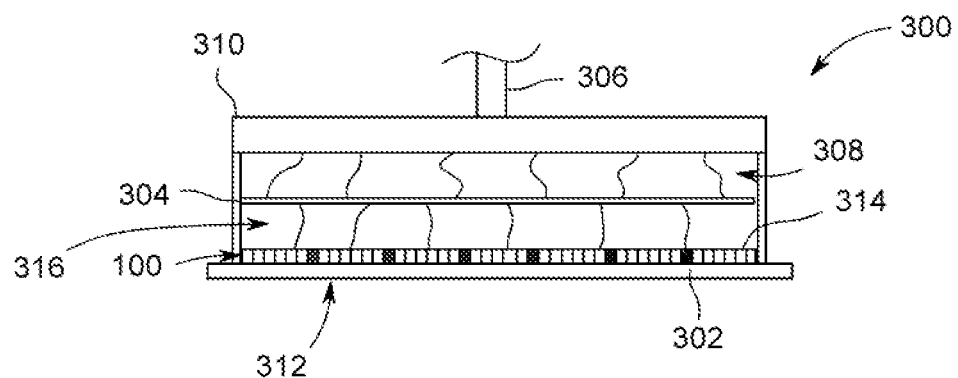
FIG. 3 is a cross section view of an exemplary ultrasonic transducer.

FIG. 3 is a cross section view of an exemplary ultrasonic transducer 300 that comprises the piezoelectric composite 100. The piezoelectric composite 100 is mounted such that the piezoelectric composite 100 contacts a substrate 302. The piezoelectric composite 100 is connected to a printed circuit board (PCB) 304 by wires 316. The wires 316 include electrically hot wires and at least one ground wire. The space between the piezoelectric composite 100 and the printed circuit board 304 may be filled with a dampening material that inhibits ultrasonic energy. The piezoelectric composite 100 has been segmented into an array by cutting deactivation cuts 314 into the piezoelectric composite 100. The printed circuit board 304 is connected to a cable 306 by wires 308 and the piezoelectric composite 100 is sealed between a case 310 and the substrate 302. In some embodiments, a lower surface 312 of the substrate 302 is then subjected to a grinding operation to produce a suitably thin layer to provide an acoustic window that is designed to maximize the transmitted ultrasonic energy.

Figure 4:
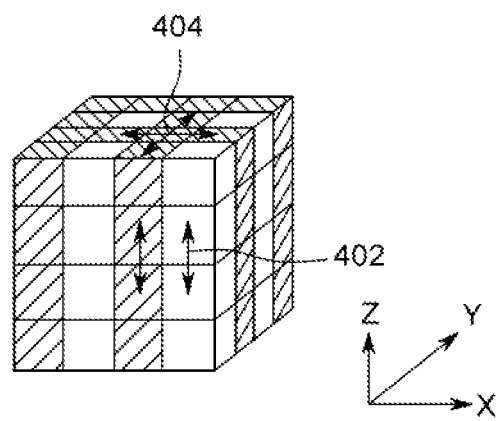
FIG. 4 is a schematic depiction of a 1-3 composite type.
Figure 5:
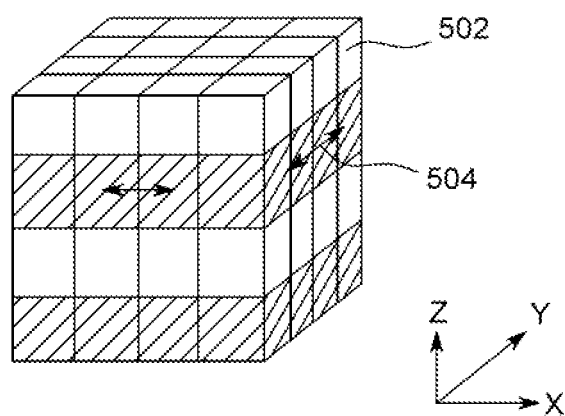
FIG. 5 is a schematic depiction of a 2-2 composite type.
Figure 6:
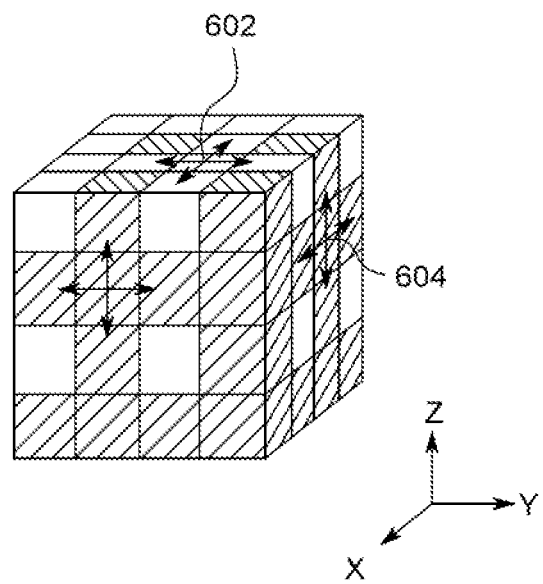
FIG. 6 and FIG. 7 are schematic depictions of two views of a 3-3 composite type.
Figure 7:
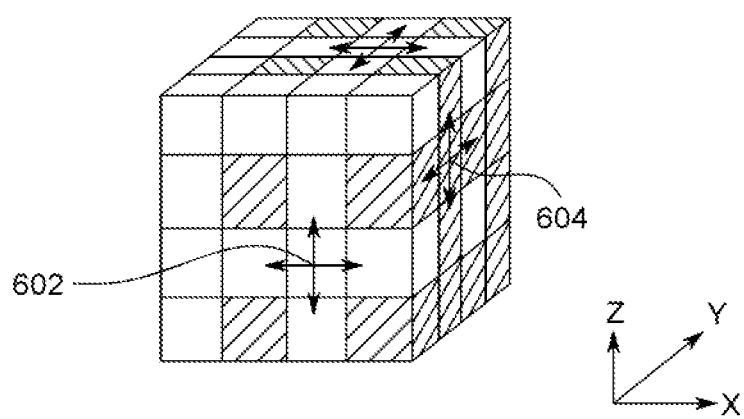

As shown in FIGS. 4-7, the piezoelectric ceramic component and the hydrophobic polymer component are arranged as different composite types. FIG. 4 is a schematic depiction of a 1-3 composite type, wherein a piezoelectric ceramic component 402 has one degree of connectivity (the Z axis) and a hydrophobic polymer component 404 has three degrees of connectivity (the X, Y and Z axes). FIG. 5 is a schematic depiction of a 2-2 composite type wherein a piezoelectric ceramic component 502 has two degrees of connectivity (the X and Y axes) and a hydrophobic polymer component 504 has two degrees of connectivity (the X and Y axes). FIG. 6 and FIG. 7 are schematic depictions of two views of a 3-3 composite type, wherein a piezoelectric ceramic component 602 and a hydrophobic polymer component 604 both have three degrees of connectivity (the X, Y and Z axes).

Figure 8:
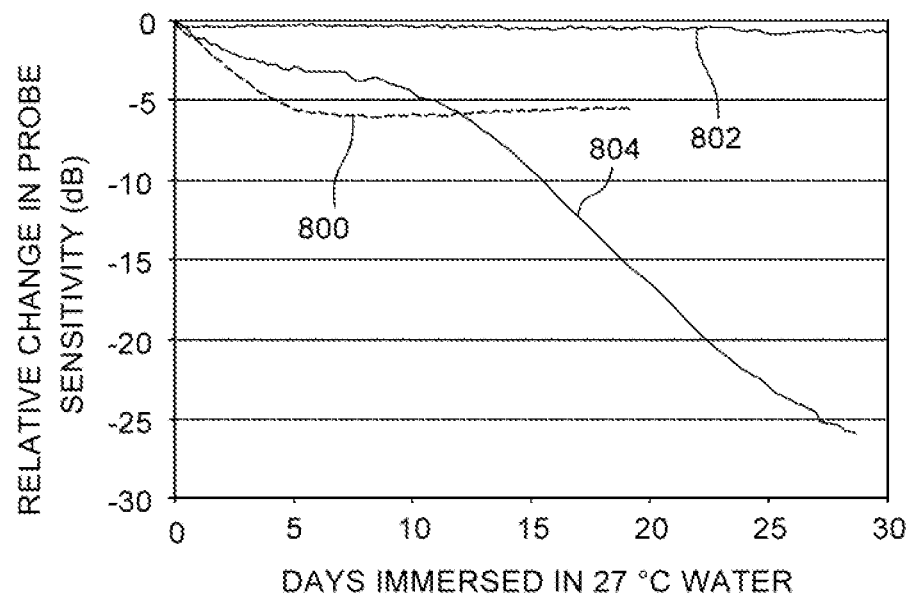
FIG. 8 is a graph depicting reductions in gain in decibels (dB) as a function of time for an ultrasonic transducer immersed underwater.

In certain applications, it is desirable to use an ultrasonic transducer in a moist environment or even immersed underwater. It is in this environment where the shortened lifetime and reductions in gain are most pronounced. The use of a watertight case to protect the piezoelectric composite formed using a non-hydrophobic epoxy has not produced a piezoelectric transducer that is suitable for commercial use. For example, FIG. 8 is a graph depicting reduction in gain in decibels (dB) as a function of time for two ultrasonic transducers immersed underwater. Line 800 shows the response of a "water-tight" ultrasonic transducer made using a non-hydrophobic epoxy sold under the brand name EPO-TEK® 301 by Epoxy Technologies, Inc. As shown in line 800 of FIG. 8, the water-tight ultrasonic transducer made using a non-hydrophobic epoxy experienced rapidly reduced gain during water immersion and began to plateau at a 5 dB to 6 dB loss after about five to ten days. Many such water-tight probes showed complete failure within three to six months of their operational life. In some extreme cases (see line 804, where the piezoelectric composite is formed from a non-hydrophobic epoxy) complete failure of the probe occurs within the first thirty days of operation.

In contrast with line 800, line 802 shows the response of an ultrasonic transducer made using a hydrophobic polymer component made according to the present disclosure. Line 800 and line 802 were both generated by immersion of the respective ultrasonic transducer in water. As shown in line 802 of FIG. 8, the ultrasonic transducer made using a hydrophobic polymer component showed no substantial reduction in gain after twenty days of water immersion. The probes formed using hydrophobic polymer components showed improved alignment and fit as well as stable thermal properties.

Figure 9:
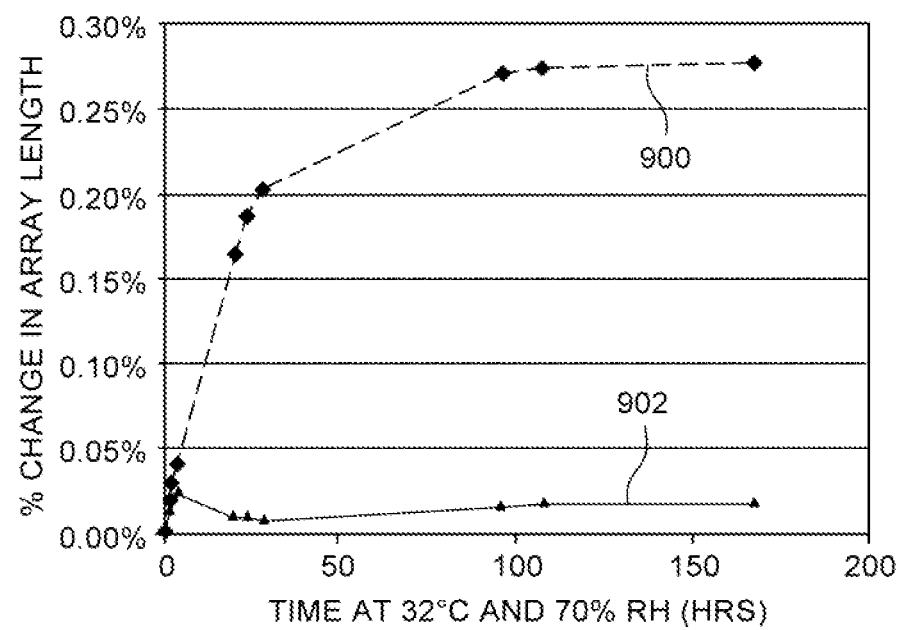
FIG. 9 is a graph depicting change in array length of ultrasonic transducers as a function of time when exposed to humid conditions.
Figure 10:
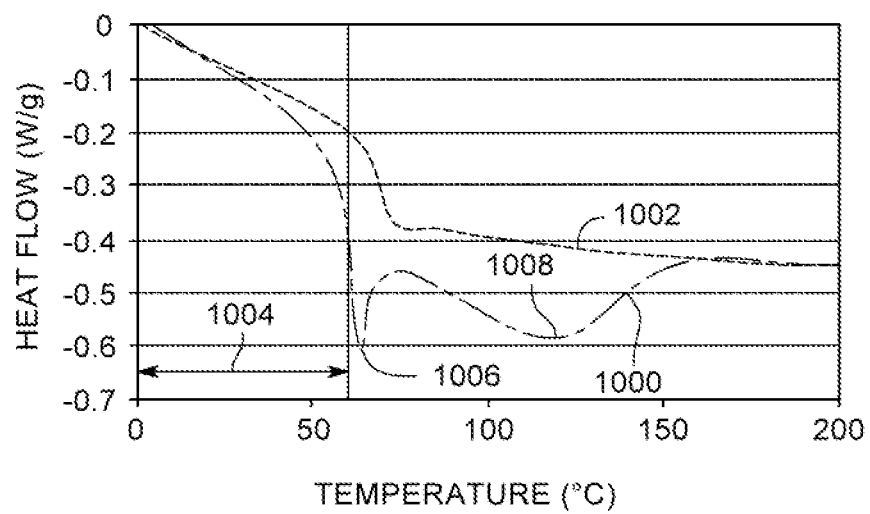
FIG. 10 is a graph depicting heat flow in a non-hydrophobic piezoelectric composite as a function of temperature.

As shown in FIG. 9, in addition to the reductions in gain, water-tight probes formed using non-hydrophobic epoxies (line 900) also experience issues with alignment and fit (due to swelling caused by water adsorption) relative to probes formed using hydrophobic polymer components (line 902). FIG. 10 is a graph illustrating of the effect of humidity on piezoelectric composites formed using a non-hydrophobic polymer component. Line 1002 shows the response of a piezoelectric composite made using a non-hydrophobic polymer component directly after curing. Line 1002 shows a step glass transition when heated. After exposure to a humid environment (32° C. at 70% relative humidity for 46 hours) the response of the material is significantly altered (see line 1000). The thermal properties are particularly relevant over temperature region 1004 (below about 60° C.) which includes the typical operating temperatures for ultrasonic transducers. Probes formed using non-hydrophobic epoxies showed an enthalpic relaxation peak 1006 that is not present directly after curing. A dip 1008 in line 1000 is indicative of the removal of water from the probe formed using non-hydrophobic epoxy.

A variety of hydrophobic polymer components may be used but the delicate nature of 1-3, 2-2 and 3-3 composite types should be taken into consideration. In one embodiment, the hydrophobic polymer component is a polymerization product of a reaction mixture comprising an epoxide monomer and a photoacid generator via cationic ring opening polymerization mechanism. Irradiation of the photoacid generator with light initiates polymerization at a moderate temperature (e.g. 20-30 ° C.). In one embodiment, the moderate temperature is near room temperature (e.g. 20-25 ° C.). In one embodiment, the polymerization is initiated in an undiluted (neat) reaction mixture. The use of a hydrophobic epoxide monomer in the absence of a nucleophilic curing agent (e.g. an amine) permits the generation of a hydrophobic polymer component with low hydroxyl concentration and high hydrophobicity.

Figure 11:
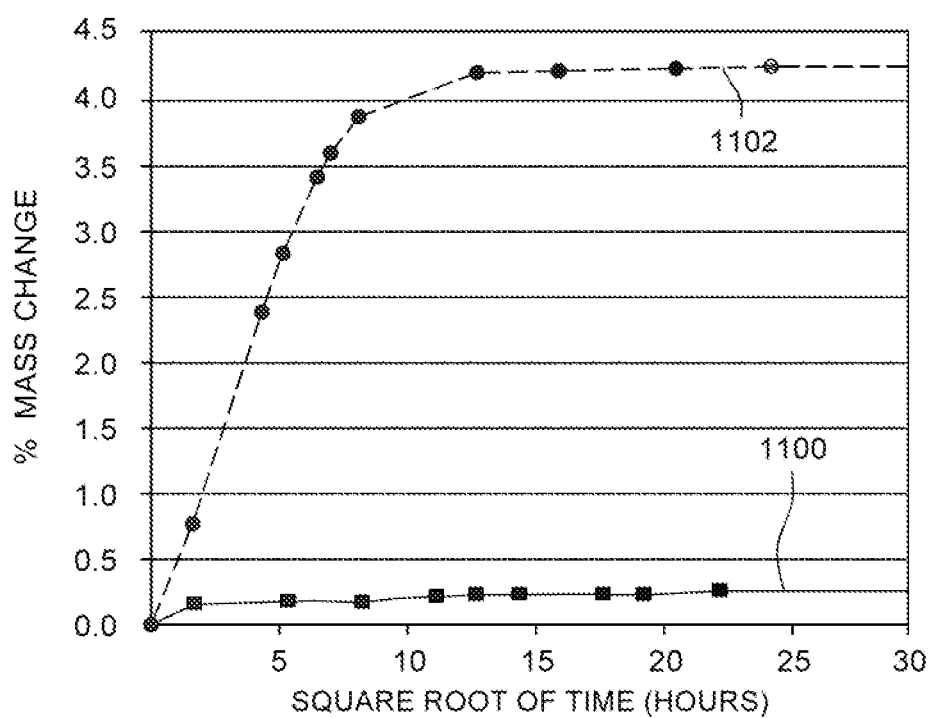
FIG. 11 is a graph depicting change in mass as a function of time for two polymer components that are used in piezoelectric composites.

A variety of hydrophobic epoxide monomers can be used to produce the hydrophobic polymer component. The term "hydrophobic polymer" refers to a substance that experiences a low change in mass when tested according to ASTM Standard D 570-98(2010)e1 "Standard Test Method for Water Absorption of Plastics." In one embodiment, the change in mass is less than 4% after ten days of water exposure. In one embodiment, the change in mass is less than 2% after ten days of water exposure. In another embodiment, the change in mass is less than 1% after ten days of water exposure. In yet another embodiment, the change in mass is less than 0.5% after ten days of water exposure. FIG. 11 is a graph depicting change in mass as a function of time for a hydrophobic polymer component (line 1100) and a non-hydrophobic polymer component (line 1102). Table 1 provides several examples of hydrophobic epoxide monomers. Entries 1-4 are examples of siloxane epoxide monomers while example 5 is an example of an ester epoxide monomer.

TABLE 1

Examples of Hydrophobic Epoxide Monomers

| Entry | Name | Structure |
|---|---|---|
| 1 | 1,3-bis-[2-(3,4-epoxy-cyclohexyl)-ethyl]-1,1,3,3-tetramethyl-disiloxane | 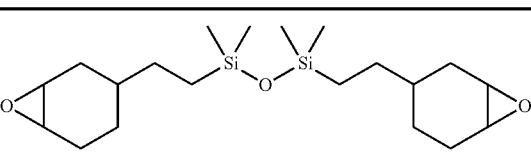 |

TABLE 1-continued

Examples of Hydrophobic Epoxide Monomers

| Entry | Name | Structure |
|---|---|---|
| 2 | 1,3-Bis(3-(2,3-epoxypropoxy)propyl)tetramethyl-disiloxane | |
| 3 | 1,1,3,5,5-Pentamethyl-1,5-bis[3-(2-oxiranylmethoxy)propyl]-3-phenyltrisiloxane | |
| 4 | 1,3-bis-[2-(3,4-epoxy-cyclohexyl)-ethyl]-1,1,3,3-tetramethyl-disiloxane | |
| 5 | 3,4-Epoxycyclohexylmethyl 3,4-epoxycyclohexane-carboxylate | |

Numerous photoacid generators may be used to initiate the polymerization reaction. Several examples of photoacid generators are provided in Table 2.

TABLE 2

Examples of Photoacid Generators

| Entry | Name | Structure |
|---|---|---|
| 1 | p-(octyloxyphenyl)phenyliodonium hexafluoroantimonate | $SbF_6^-$ |

TABLE 2-continued

Examples of Photoacid Generators

| Entry | Name | Structure |
|---|---|---|
| 2 | p-isopropyl-2'-methyldiphenyliodonium Tetrakis(pentafluorophenyl) borate | $B(C_6F_5)_4^-$ (diaryliodonium cation structure) |
| 3 | Triarylsulfonium hexafluoroantimonate salts, mixed | (triarylsulfonium $SbF_6^-$ structures) |

In one embodiment, the reaction mixture comprises between 97% and 99.75% (wt.) neat epoxide monomer and between 0.25% and 3% (wt.) photoacid generator. In one such embodiment, the reaction mixture consists essentially of 97% (wt.) and 99.75% (wt.) neat epoxide monomer with the balance being photoacid generator. In another embodiment, the reaction mixture further comprises an epoxide toughening monomer and/or an adhesion promoter. In one such embodiment, the reaction mixture comprises between 60% (wt.) and 99.75% (wt.) neat epoxide monomer, between 0.25% (wt.) and 3% (wt.) photoacid generator, between 0.25% (wt.) and 40% (wt.) epoxide toughening monomer and between 0% (wt.) and 6% (wt.) adhesion promoter. In one such embodiment, between 0.25% (wt.) and 6% (wt.) of the adhesion promoter is present.

Epoxide toughening monomers are resins that increase the flexibility of the resulting hydrophobic polymer component, which helps deter crack growth and failure of piezoelectric composites. Several examples of epoxide toughening monomers are provided in Table 3 wherein the epoxide toughening monomer comprises dimethylsiloxane moieties and at least one epoxysiloxane moiety. Other epoxide toughening monomers are also suitable. Epoxide toughening monomers generally decrease the amount of cross-linking and lower the glass transition temperature (Tg) relative to a corresponding hydrophobic polymer component that omits the epoxide toughening monomer.

TABLE 3

Examples of Epoxide Toughening Monomers

Epoxycyclohexylethylmethylsiloxane - dimethylsiloxane copolymers

| Entry | Mole % (epoxycyclohexyl)-ethylmethylsiloxane | Molecular weight (g per mole) | Viscosity (centistokes) |
|---|---|---|---|
| 1 | 2-3% | 18,000-20,000 | 650-800 |
| 2 | 3-4% | 18,000-20,000 | 650-850 |
| 3 | 8-10% | 10,000-12,000 | 300-450 |

Adhesion promoters include alkoxyl silanes containing an epoxide moiety. Epoxide moieties include glycidyl and/or 3,4-epoxycyclohexyl groups. Table 4 provides examples of several adhesion promoters.

TABLE 4

Examples of Adhesion promoters

| Entry | Name | Structure |
|---|---|---|
| 1 | 2-(3,4-epoxycyclohexyl)ethyltrimethoxysilane | |
| 2 | 2-(3,4-epoxycyclohexyl)ethyltriethoxysilane | |
| 3 | (3-glycidoxypropyl)trimethoxysilane | |
| 4 | (3-glycidoxypropyl)triethoxysilane | |

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A piezoelectric composite comprising a plurality of piezoelectric ceramic components and a hydrophobic polymer component, the hydrophobic polymer component being a polymerization product of a reaction mixture comprising an epoxide monomer and photoacid generator, wherein the plurality of piezoelectric ceramic components and the hydrophobic polymer component are arranged to form a composite type selected from the group consisting of a 1-3 composite type, a 2-2 composite type, and a 3-3 composite type.

2. The piezoelectric composite as recited in claim 1, wherein the epoxide monomer is a siloxane epoxide monomer.

3. The piezoelectric composite as recited in claim 1, wherein the epoxide monomer is a neat epoxide monomer.

4. The piezoelectric composite as recited in claim 3, wherein the photoacid generator is present in the reaction mixture at a concentration between 0.25% by weight and 3% by weight.

5. The piezoelectric composite as recited in claim 1, wherein the hydrophobic polymer is a polymerization product of a reaction mixture comprising the epoxide monomer, the photoacide generator, and an epoxide toughening monomer that is different than the epoxide monomer.

6. The piezoelectric composite as recited in claim 5, wherein the epoxide toughening monomer comprises a plurality of dimethylsiloxane moieties and at least one epoxide moiety.

7. The piezoelectric composite as recited in claim 5, wherein the epoxide toughening monomer is present in the reaction mixture at a concentration between 0.25% by weight and 40% by weight.

8. The piezoelectric composite as recited in claim 1, wherein the hydrophobic polymer is a polymerization product of a reaction mixture comprising the epoxide monomer, the photoacid generator, an epoxide toughening monomer that is different than the epoxide monomer, and an adhesion promoter.

9. The piezoelectric composite as recited in claim 8, wherein the adhesion promoter is present in the reaction mixture at a concentration between 0.25% by weight and 6% by weight.

10. The piezoelectric composite as recited in claim 1, wherein the hydrophobic polymer component has less than a 4% change in mass when tested according to ASTM Standard D 570-90(2010)e1.

11. The piezoelectric composite as recited in claim 1, wherein the piezoelectric composite type is a 1-3 composite type.

12. The piezoelectric composite as recited in claim 11, wherein the plurality of piezoelectric ceramic components are posts having a length-to-width aspect ratio of at least 2.5 to 1.

13. The piezoelectric composite as recited in claim 1, wherein the plurality of piezoelectric ceramic components and the hydrophobic polymer component are arranged such that the plurality of piezoelectric ceramic components occupies between 20% and 80% by volume of the piezoelectric composite.

14. The piezoelectric composite as recited in claim 13, wherein the plurality of piezoelectric ceramic components and the hydrophobic polymer component are arranged such that the hydrophobic polymer component occupies between 20% and 80% by volume of the piezoelectric composite.

15. An ultrasonic transducer comprising:
a piezoelectric composite comprising a plurality of piezoelectric ceramic components and a hydrophobic polymer component, wherein the plurality of piezoelectric ceramic components and the hydrophobic polymer component are arranged to form a composite type selected from the group consisting of a 1-3 composite type, a 2-2 composite type and a 3-3 composite type;
a printed circuit board providing an electrical connection between the plurality of piezoelectric ceramic components and a cable;
a substrate contacting terminal ends of the plurality of piezoelectric ceramic components to provide an acoustic energy transmission window; and
a case, joined to the substrate to encase the piezoelectric composite and the printed circuit board, wherein the cable provides an electrical connection outside of the case.

* * * * *